(12) United States Patent
Matsuda et al.

(10) Patent No.: US 10,542,234 B2
(45) Date of Patent: Jan. 21, 2020

(54) ELECTRONIC APPARATUS

(71) Applicant: FUJI XEROX CO., LTD., Tokyo (JP)

(72) Inventors: Jiro Matsuda, Kanagawa (JP); Tohru Fuse, Kanagawa (JP); Akihiko Naya, Kanagawa (JP); Takahiro Saito, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 113 days.

(21) Appl. No.: 15/784,189

(22) Filed: Oct. 16, 2017

(65) Prior Publication Data

US 2018/0115737 A1 Apr. 26, 2018

(30) Foreign Application Priority Data

Oct. 24, 2016 (JP) .................. 2016-207510

(51) Int. Cl.
| | |
|---|---|
| *H04N 5/63* | (2006.01) |
| *H01L 31/02* | (2006.01) |
| *G05F 1/67* | (2006.01) |
| *H02J 7/00* | (2006.01) |
| *H01L 31/053* | (2014.01) |
| *H01L 31/048* | (2014.01) |

(52) U.S. Cl.
CPC .............. *H04N 5/63* (2013.01); *G05F 1/67* (2013.01); *H01L 31/02008* (2013.01); *H01L 31/02021* (2013.01); *H01L 31/048* (2013.01); *H01L 31/053* (2014.12)

(58) Field of Classification Search
CPC .............. G05F 1/67; H01L 31/02008; H01L 31/02021; H01L 31/048; H01L 31/053; H01L 31/02; H04N 5/63; H01M 10/44; H02J 7/00; H02J 7/0068; H02J 7/345; H02J 7/35; Y02E 10/58; H03K 17/017509; H03K 19/0016; H04W 4/023; H04W 4/025

See application file for complete search history.

(56) References Cited

U.S. PATENT DOCUMENTS

| | | | |
|---|---|---|---|
| 2009/0212826 A1 | 8/2009 | Mizunaga | |
| 2010/0140490 A1* | 6/2010 | Tsubota | ............... G01T 1/2928 250/370.08 |

(Continued)

FOREIGN PATENT DOCUMENTS

| | | |
|---|---|---|
| JP | H11-340801 | 12/1999 |
| JP | 2009-200944 | 9/2009 |
| JP | 2010-141552 | 6/2010 |

*Primary Examiner* — Vuthe Siek
(74) *Attorney, Agent, or Firm* — JCIPRNET

(57) ABSTRACT

An electronic apparatus includes solar cells, an accumulation portion that accumulates power generated by the solar cells, an electronic apparatus main body portion that is operated by using power accumulated in the accumulation portion, and an operation control circuit that performs control so that, in a case where a voltage of the accumulation portion increases, an operation of the electronic apparatus main body portion is started if the voltage of the accumulation portion exceeds a first threshold voltage, and, in a case where a voltage of the accumulation portion decreases, an operation of the electronic apparatus main body portion is stopped if the voltage of the accumulation portion is less than a second threshold voltage which is smaller than the first threshold voltage.

16 Claims, 11 Drawing Sheets

(56) References Cited

U.S. PATENT DOCUMENTS

2013/0293202 A1* 11/2013 Utsunomiya ......... H02J 7/0068
320/166
2015/0163887 A1* 6/2015 Kusakari ............ H05B 37/0272
315/291
2017/0207649 A1* 7/2017 Shichino ................ H02J 7/025

* cited by examiner

FIG. 10
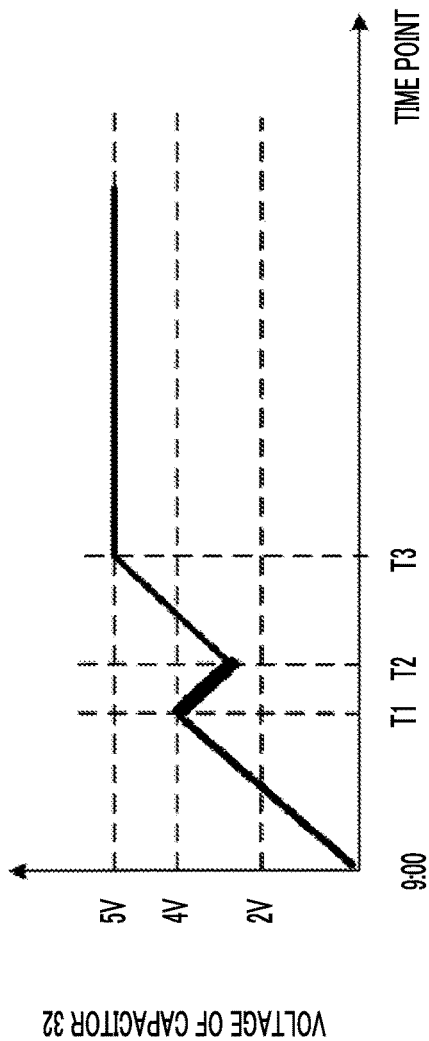
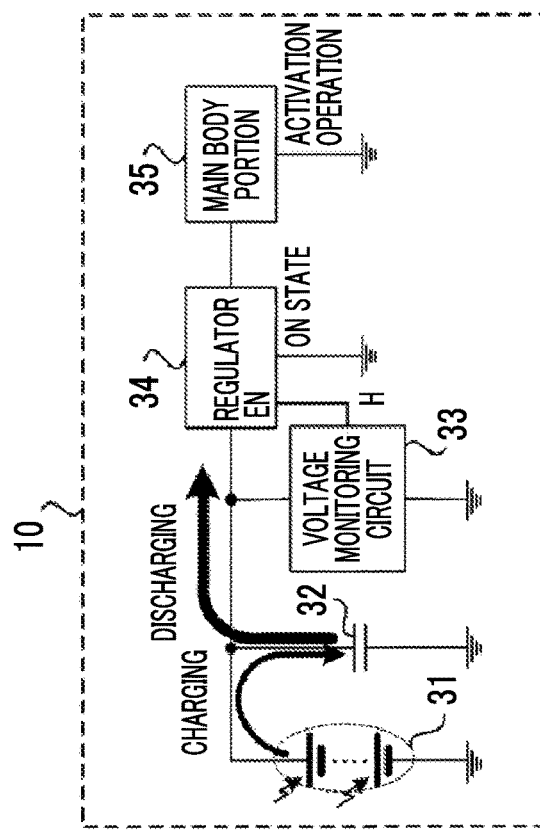

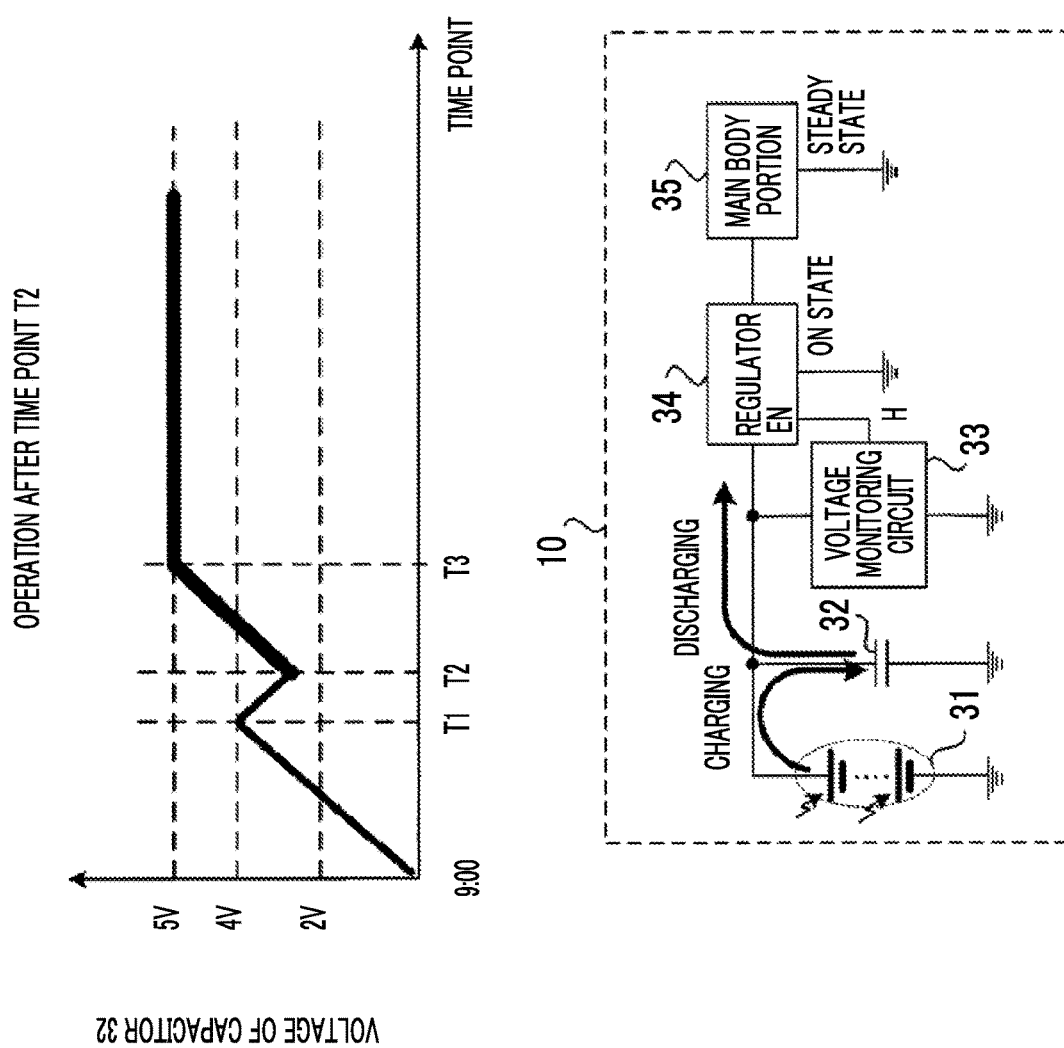

ELECTRONIC APPARATUS

CROSS-REFERENCE TO RELATED APPLICATIONS

This application is based on and claims priority under 35 USC 119 from Japanese Patent Application No. 2016-207510 filed Oct. 24, 2016.

BACKGROUND

Technical Field

The present invention relates to an electronic apparatus.

SUMMARY

According to an aspect of the invention, there is provided an electronic apparatus including solar cells; an accumulation portion that accumulates power generated by the solar cells; an electronic apparatus main body portion that is operated by using power accumulated in the accumulation portion; and an operation control circuit that performs control so that, in a case where a voltage of the accumulation portion increases, an operation of the electronic apparatus main body portion is started if the voltage of the accumulation portion exceeds a first threshold voltage, and, in a case where a voltage of the accumulation portion decreases, an operation of the electronic apparatus main body portion is stopped if the voltage of the accumulation portion is less than a second threshold voltage which is smaller than the first threshold voltage.

BRIEF DESCRIPTION OF THE DRAWINGS

Exemplary embodiment(s) of the present invention will be described in detail based on the following figures, wherein:

FIG. 10 is a diagram for explaining a state of an operation of the beacon transmission apparatus 10 from the time point T1 to a time point T2; and FIG. 11 is a diagram for explaining a state of an operation of the beacon transmission apparatus 10 after the time point T2.

DETAILED DESCRIPTION

Next, a description will be made of an exemplary embodiment of the invention with reference to the drawings.

Figure 1:
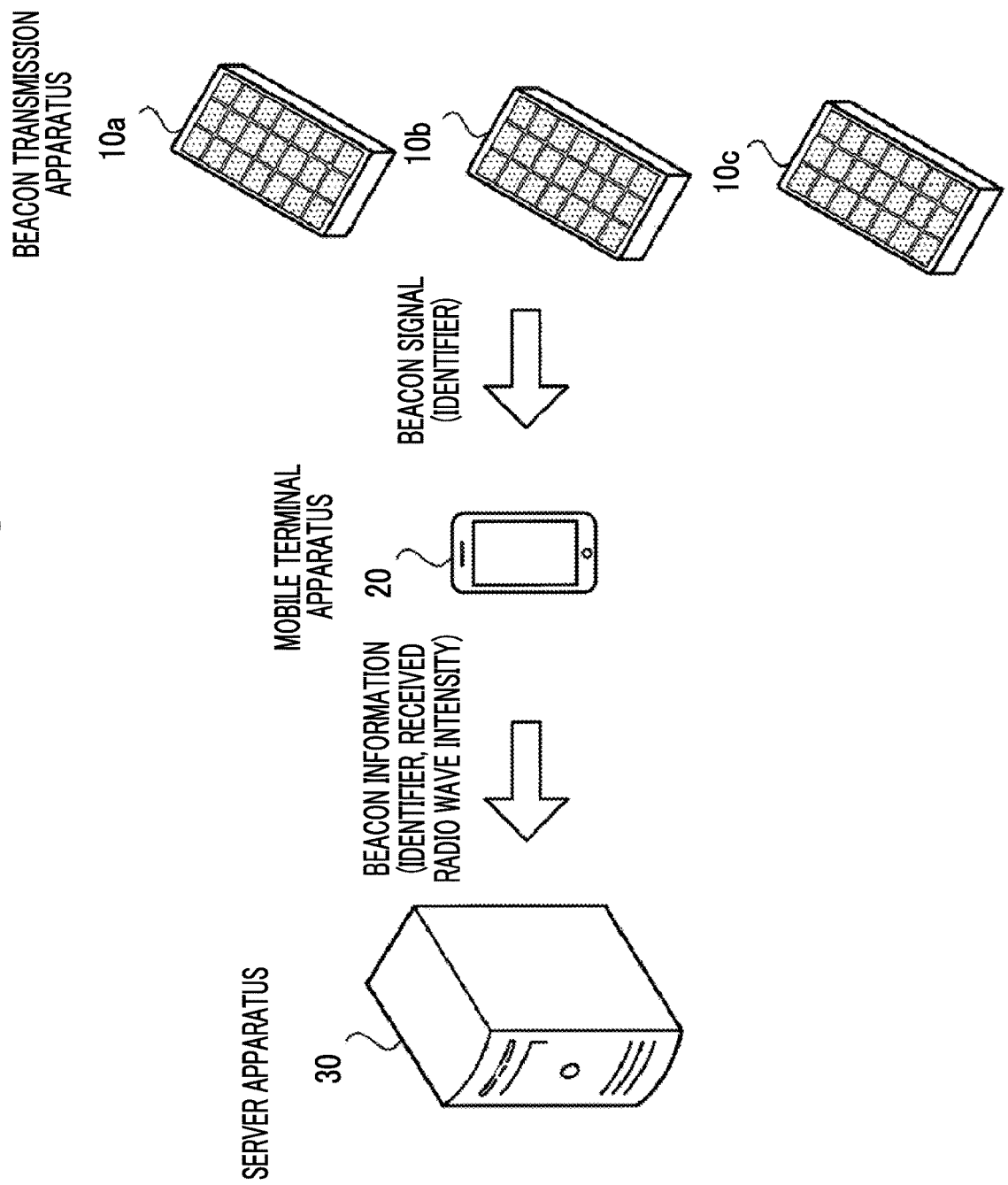
FIG. 1 is a diagram illustrating a configuration of a location identification system including a beacon transmission apparatus 10 according to an exemplary embodiment of the invention.

FIG. 1 is a diagram illustrating a configuration of a location identification system including a beacon transmission apparatus 10 according to an exemplary embodiment of the invention. FIG. 1 illustrates plural beacon transmission apparatuses 10 as beacon transmission apparatuses 10a to 10c.

The location identification system in the present exemplary embodiment is a system for specifying the current position of a mobile terminal apparatus 20, and is, as illustrated in FIG. 1, formed of the beacon transmission apparatuses 10a to 10c, the portable mobile terminal apparatus 20 such as a smart phone, a tablet terminal apparatus, or a personal computer (hereinafter, abbreviated to a PC), and a server apparatus 30.

FIG. 1 illustrates only a single mobile terminal apparatus 20, but, actually, plural mobile terminal apparatus 20 are included in the location identification system.

The invention is applicable to any apparatus as long as the mobile terminal apparatus 20 is connectable to the position information server apparatus 30 via a communication network.

Each of the beacon transmission apparatuses 10a to 10c has a function of transmitting a beacon signal including identifier (ID) information for specifying the beacon transmission apparatus via a wireless communication line such as WiFi. Each of the beacon transmission apparatuses 10a to 10c is provided at a location where a position of the mobile terminal apparatus 20 is desired to be specified. For example, the beacon transmission apparatuses 10a to 10c are provided at different locations such as the inside of a conference room and a corridor, and normally transmit beacon signals including the identifiers.

In a case where the mobile terminal apparatus 20 comes close to the vicinities of the locations where the beacon transmission apparatuses 10a to 10c are provided, the mobile terminal apparatus 20 receives beacon signals transmitted from the beacon transmission apparatuses 10a to 10c, and transmits information regarding the identifiers included in the received beacon signals and information regarding received radio wave intensities when the beacon signals are received, to the server apparatus 30 as signal information.

If the signal information is received from the mobile terminal apparatus 20, the server apparatus 30 estimates a position of the mobile terminal apparatus 20 on the basis of the information regarding the identifiers or the information regarding the received radio wave intensities included in the signal information. Specifically, the server apparatus 30 stores respective installation positions of the beacon transmission apparatuses 10a to 10c, determines a beacon transmission apparatus around which the mobile terminal apparatus 20 is present on the basis of the information regarding the identifiers in the received signal information, and calculates a distance from the beacon transmission apparatus on the basis of the received radio wave intensity, so as to estimate the current position of the mobile terminal apparatus 20.

The server apparatus 30 receives signal information based on the plural beacon transmission apparatuses from the mobile terminal apparatus 20, and may thus estimate a more accurate position.

Figure 2:
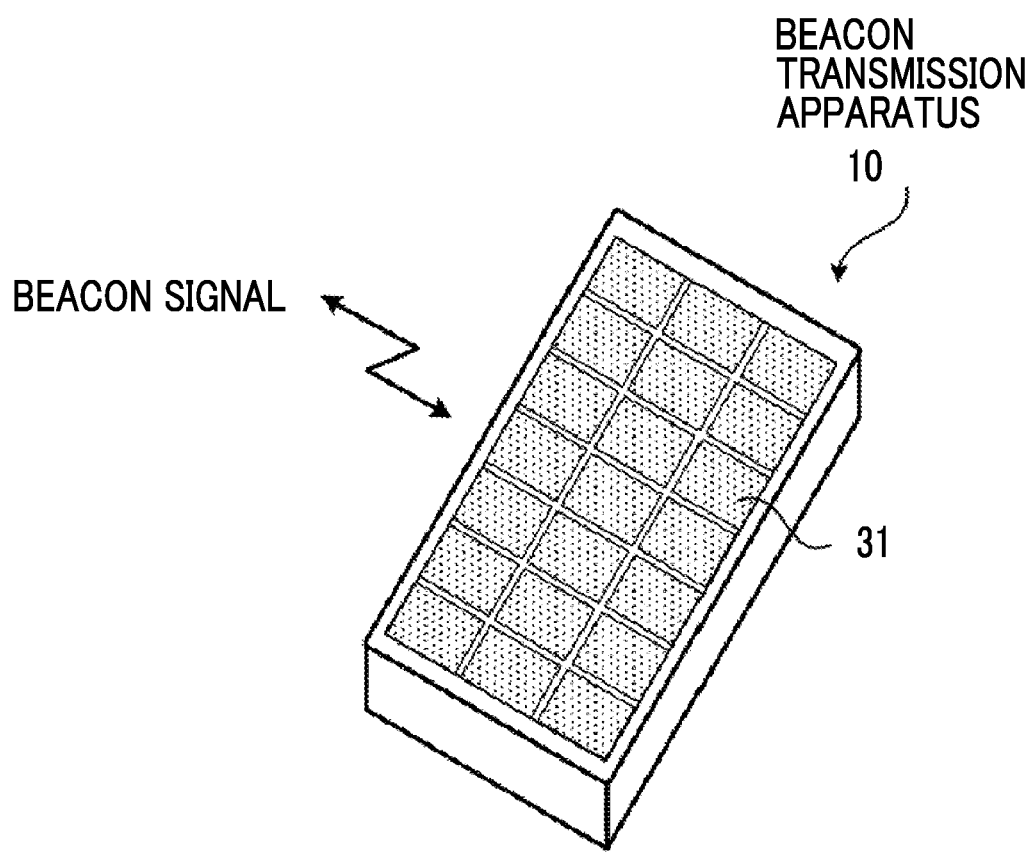
FIG. 2 is a diagram illustrating an exterior of the beacon transmission apparatus 10 according to the exemplary embodiment of the invention.

Next, FIG. 2 illustrates an exterior of the beacon transmission apparatus 10. The beacon transmission apparatus 10 is provided with solar cells 31 on a surface thereof, and is thus configured to be able to be operated without being connected to an external power source.

If connection to an AC power source is necessary in a case where the beacon transmission apparatuses 10 are provided at various locations such as an office, a conference room, and a corridor, there is a restriction in an installation location without a degree of freedom. If a power source is drawn to a location where the beacon transmission apparatus 10 is provided through an extension cable or the like, this is not realistic in a case where many beacon transmission apparatuses 10 are used since the time and effort for installation are considerable.

If the beacon transmission apparatus 10 is driven by using a battery or the like, there is a problem in that the battery is required to be replaced in a case where the battery runs out. Even if a rechargeable secondary battery is used, there is a problem in that the battery is required to be charged in a case where the battery runs out.

Thus, the beacon transmission apparatus 10 in the present exemplary embodiment is configured to be able to be provided at various locations without requiring connection to an external power source since the solar cells 31 such as solar panels are provided.

The beacon transmission apparatus 10 of the present exemplary embodiment may be operated only in a case where an office or the like is operating, and lighting is in an ON state.

Figure 3:
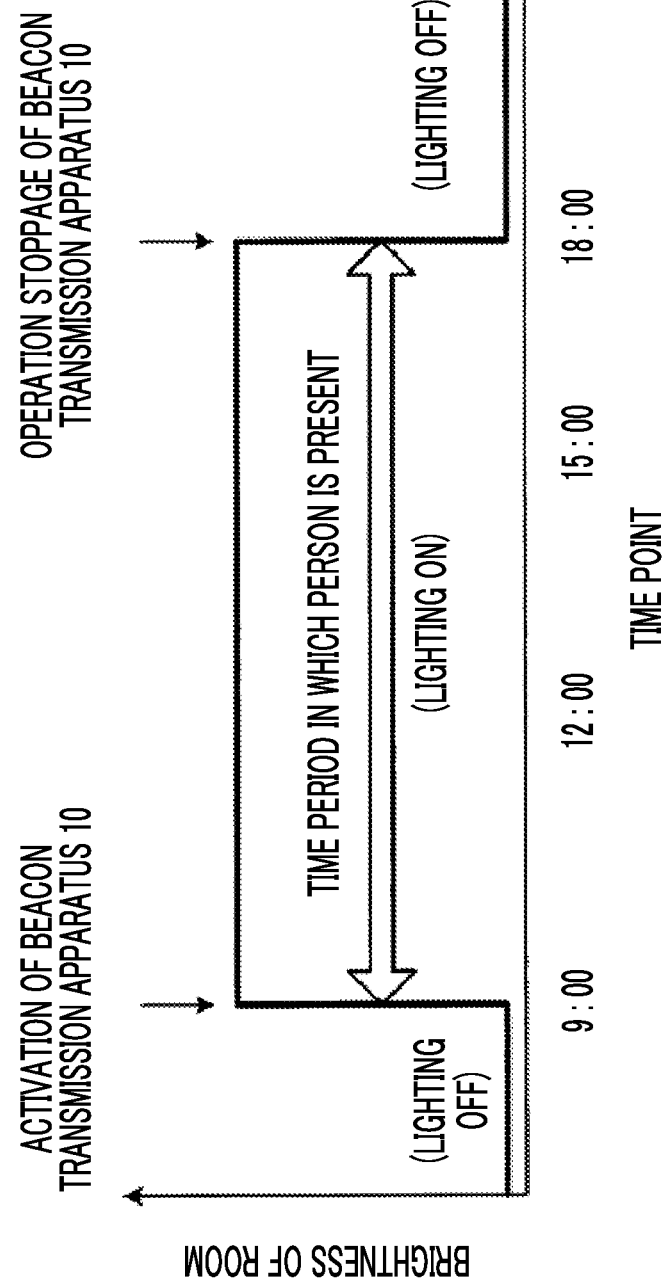
FIG. 3 is a diagram for explaining a schematic operation of the beacon transmission apparatus 10 for a day according to the exemplary embodiment of the invention.

With reference to FIG. 3, a description will be made of a schematic operation of the beacon transmission apparatus 10 of the present exemplary embodiment, for example, in a case where the beacon transmission apparatus 10 is used in an office.

In this office, for example, regular working time is 9:00 to 18:00. Thus, if an employee comes to the office at 9:00 in the morning, and thus lighting is turned on, the solar cells 31 start to generate power, and thus the beacon transmission apparatus 10 is activated. In the daytime in which a person is present in the office, the beacon transmission apparatus 10 continues to generate electric power by using light of the lighting which is in an ON state. If the employee leaves the office at 18:00 in the evening, and thus the lighting in the office is turned off, the beacon transmission apparatus 10 does not generate power, and, as a result, the beacon transmission apparatus 10 stops an operation.

A description will be made of a circuit configuration of the beacon transmission apparatus 10 of the present exemplary embodiment with reference to FIG. 4.

Figure 4:
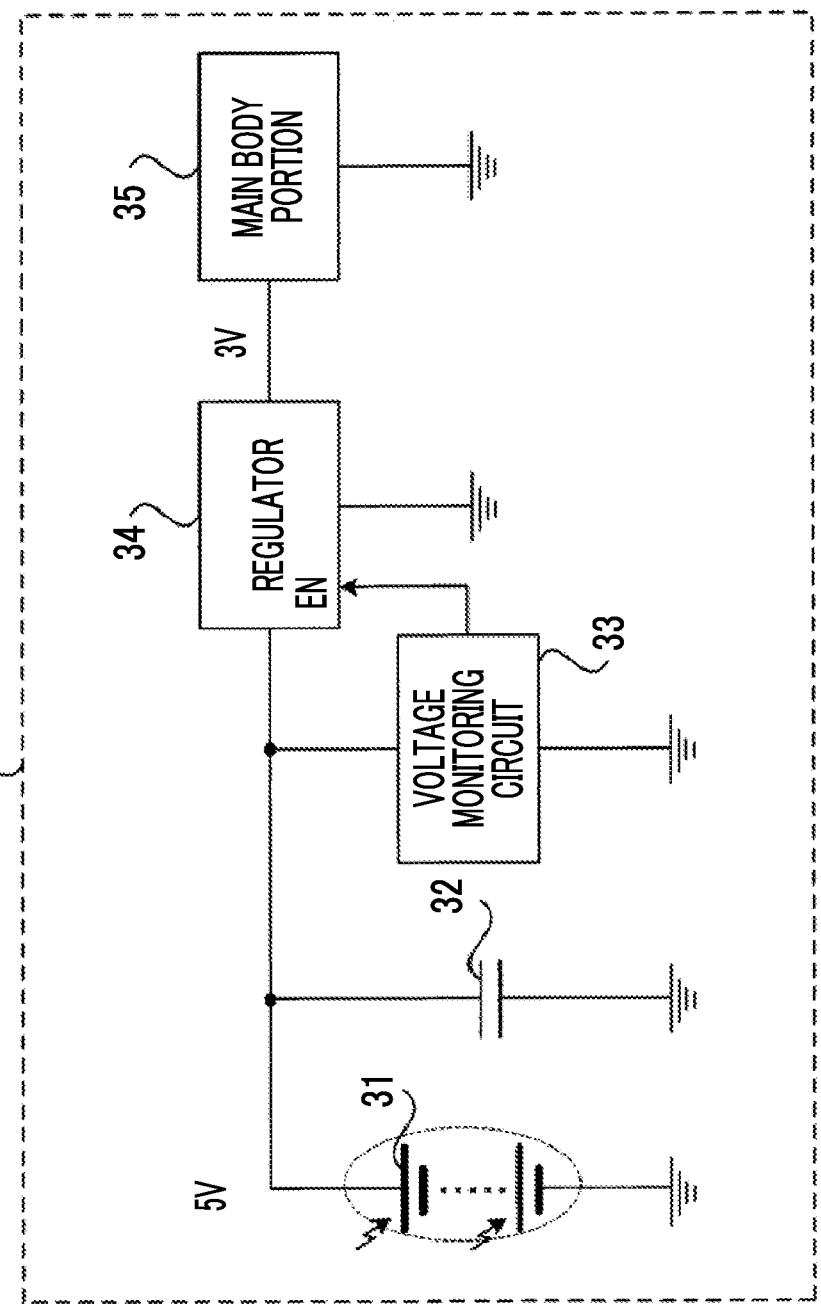
FIG. 4 is a diagram for explaining a circuit configuration of the beacon transmission apparatus 10 according to the exemplary embodiment of the invention.

As illustrated in FIG. 4, the beacon transmission apparatus 10 of the present exemplary embodiment includes the solar cells (photoelectric cells) 31 which receive sunlight or lighting light, and convert light energy into electric energy so as to generate electric power, a capacitor (accumulation portion) 32 which accumulates power generated by the solar cells 31, a voltage monitoring circuit 33, a regulator 34, and a main body portion 35.

The main body portion 35 is an electronic apparatus main body portion which is operated by using electric power accumulated in the capacitor 32. Specifically, the main body portion 35 is operated as a transmission portion which transmits a beacon signal including an identifier (identification information) of the beacon transmission apparatus 10 to the periphery thereof through wireless communication such as WiFi.

The regulator 34 is a constant voltage circuit which converts a voltage accumulated in the capacitor 32 into a voltage of 3 V which is an operation voltage of the main body portion 35, and outputs the voltage. The regulator 34 is provided with an enable terminal (EN), performs a voltage conversion operation so as to perform an operation of supplying an output voltage to the main body portion 35 if the enable terminal transitions to a high level, and stops the voltage conversion operation so as not to supply a voltage to the main body portion 35 if the enable terminal transitions to a low level.

The capacitor (accumulation portion) 32 is a capacitor called a super capacitor (SCAP), and is, for example, an electric double layered capacitor having the capacitance of 0.02 farad (F).

In the capacitor 32, power generated by the solar cells 31 is accumulated therein, and thus a voltage gradually increases. Since a rated value of a generated voltage of the solar cells 31 is 5 V, if the solar cells 31 start to generate power, a voltage of the capacitor 32 also gradually increases, and finally reaches 5 V after a sufficient time elapses.

The voltage monitoring circuit 33 is an operation control circuit which performs control so that an operation of the main body portion 35 is started if a voltage of the capacitor 32 exceeds 4 V (first threshold voltage) in a case where the voltage of the capacitor 32 increases, and an operation of the main body portion 35 is stopped if the voltage of the capacitor 32 is less 2 V (second threshold voltage) lower than 4 V in a case where the voltage of the capacitor 32 decreases.

Specifically, the voltage monitoring circuit 33 controls an operation of the main body portion 35 by outputting a control signal to the enable terminal (EN) of the regulator 34 so that the regulator 34 switches between operation and stoppage. In other words, if a control signal from the voltage monitoring circuit 33 transitions to a high level, the regulator 34 is operated to output a voltage to the main body portion 35, and, if the control signal from the voltage monitoring circuit 33 transitions to a low level, the regulator 34 stops to be operated so as not to output a voltage to the main body portion 35.

Next, a specific circuit configuration of the voltage monitoring circuit 33 will be described with reference to FIG. 5.

Figure 5:
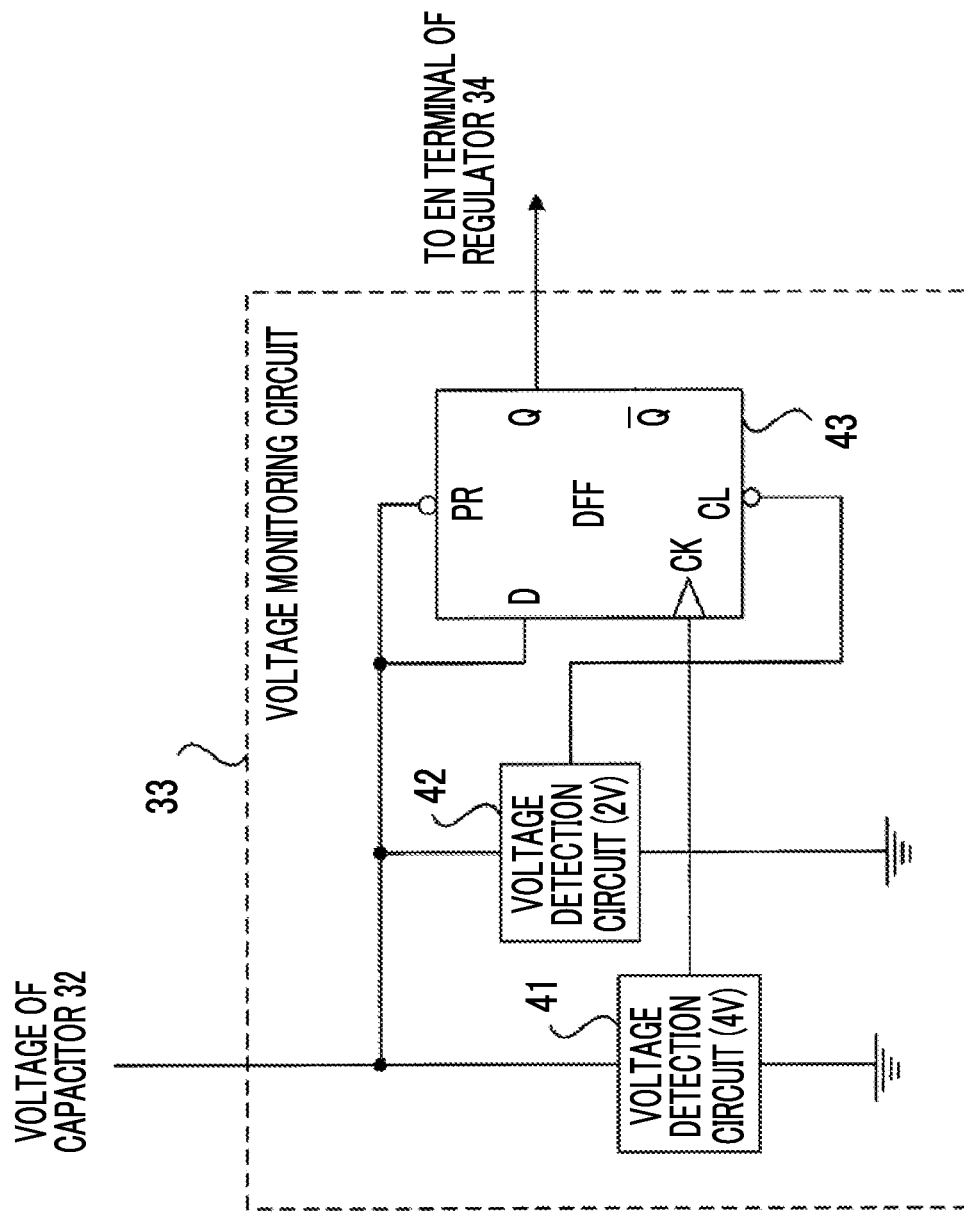
FIG. 5 is a diagram illustrating a specific circuit configuration of a voltage monitoring circuit 33.

As illustrated in FIG. 5, the voltage monitoring circuit 33 is formed of voltage detection circuits 41 and 42, and a D flip-flop (DFF) circuit 43.

The voltage detection circuit 41 outputs a signal which transitions to a high level in a case where a voltage of the capacitor 32 exceeds 4 V, and transitions to a low level in a case where the voltage thereof is equal to or lower than 4 V. The voltage detection circuit 42 outputs a signal which transitions to a high level in a case where a voltage of the capacitor 32 exceeds 2 V, and transitions to a low level in a case where the voltage thereof is equal to or lower than 2 V.

The DFF circuit 43 is a logic circuit which detects rising edge of an output signal from the voltage detection circuit 41 so as to cause a control signal for controlling an operation of the main body portion 35 to transition to a high level, that is, an active state, and detects falling edge of an output signal from the voltage detection circuit 42 so as to cause the control signal for controlling an operation of the main body portion 35 to transition to a low level, that is, an inactive state.

Specifically, a voltage of the capacitor 32 is applied to an input terminal D of the DFF circuit 43, an output signal from the voltage detection circuit 41 is input to a rising edge detection terminal CK, and an output signal from the voltage detection circuit 42 is input to a falling edge detection terminal CL. A high level signal is applied to a preset terminal PR of the DFF circuit 43, and a logic output from an output terminal Q is output to the enable terminal EN of the regulator 34 as a control signal.

Figure 6:
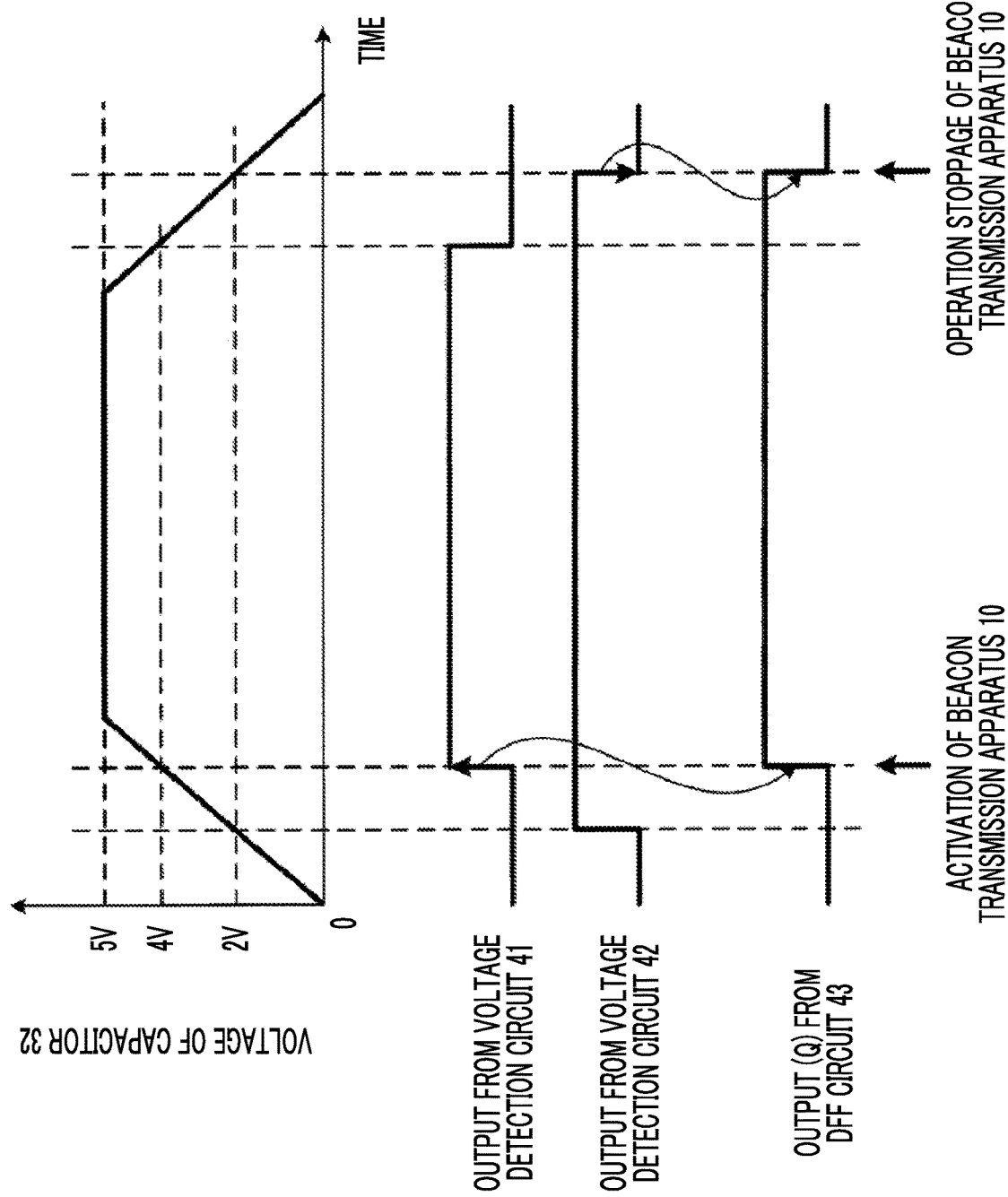
FIG. 6 is a timing chart for explaining an operation of the voltage monitoring circuit 33.

Next, a description will be made of an operation of the voltage monitoring circuit 33 with such a configuration with reference to a timing chart of FIG. 6.

First, in an initial state, the output terminal Q of the DFF circuit 43 is at a low level. If a voltage of the capacitor 32 increases, and then a voltage value exceeds 2 V, an output voltage from the voltage detection circuit 42 first changes from a low level to a high level. If a voltage of the capacitor 32 further increases, and then a voltage value exceeds 4 V, an output voltage from the voltage detection circuit 41 changes from a low level to a high level.

Then, the DFF circuit 43 detects rising edge of the output signal from the voltage detection circuit 41, and outputs a logic of the input terminal D to the output terminal Q. In other words, the logic of the output terminal Q of the DFF circuit 43 changes to a high level.

Since a logic state of the output terminal Q of the DFF circuit 43 is applied to the enable terminal of the regulator 34 as a control signal, the regulator 34 outputs an output voltage of 3 V to the main body portion 35, and thus the main body portion 35 is activated. Thus, the beacon transmission apparatus 10 is also brought into an operation state.

Next, if a voltage of the capacitor 32 gradually decreases from 5 V, and then a voltage value becomes 4 V or less, an output voltage from the voltage detection circuit 41 first changes from a high level to a low level. However, a logic state of the output terminal Q of the DFF circuit 43 does not change.

If a voltage of the capacitor 32 further decreases, and then a voltage value becomes 2 V or less, an output voltage from the voltage detection circuit 42 changes from a high level to a low level. Then, the DFF circuit 43 detects falling edge of an output signal from the voltage detection circuit 42, and outputs a logic of the input terminal D to the output terminal Q. Since the voltage value of the capacitor 32 is equal to or lower than 2 V at this time, the logic of the input terminal D is at a low level, and thus a logic of the output terminal Q of the DFF circuit 43 also changes to a low level.

Thus, the control signal which is output to the enable terminal of the regulator 34 changes to a low level so that an output voltage from the regulator 34 becomes 0 V, and thus the main body portion 35 is brought into an operation stoppage state. In other words, the beacon transmission apparatus 10 is also brought into an operation stoppage state.

In other words, the voltage monitoring circuit 33 is configured to perform a hysteresis (history effect) operation in which, in a case where a voltage of the capacitor 32 increases, the regulator 34 OS brought into an operation state so as to activate the main body portion 35 if a voltage value exceeds 4 V, and, in a case where a voltage of the capacitor 32 decreases, the regulator 34 is brought into a stoppage state so as to stop an operation of the main body portion 35 if a voltage value is 2 V or less.

Figure 7:
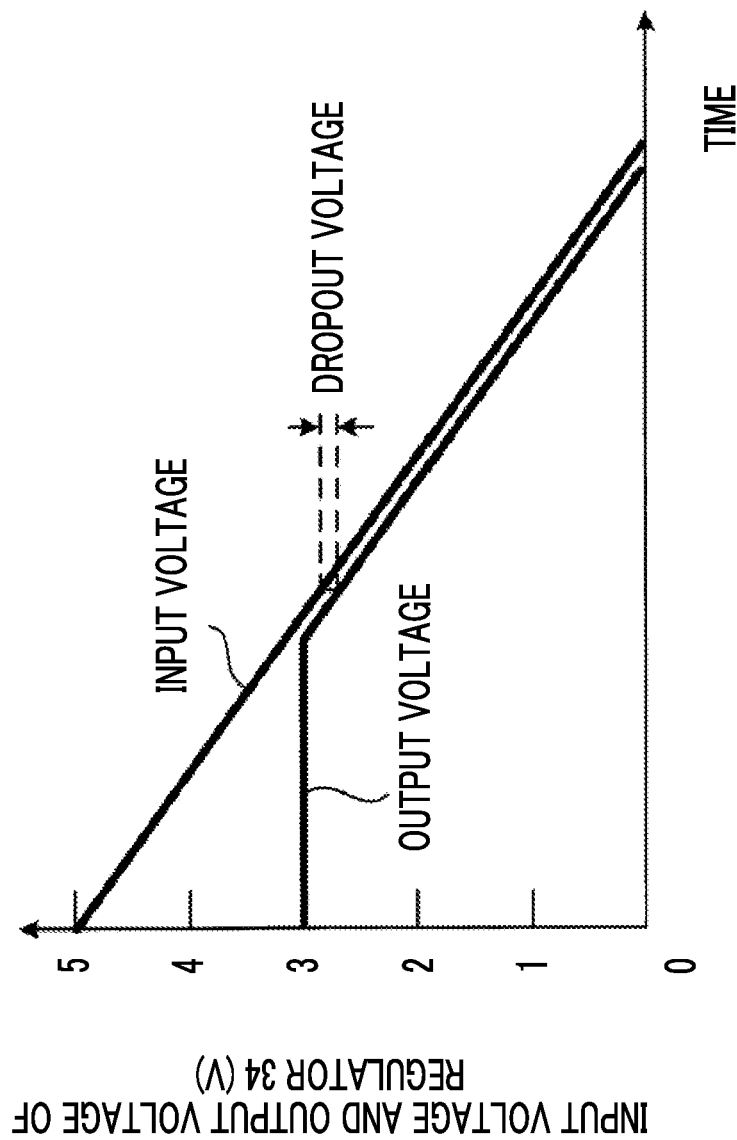
FIG. 7 is a diagram for explaining a relationship between an input voltage and an output voltage of a regulator 34.

Next, with reference to FIG. 7, a description will be made of a relationship between an input voltage and an output voltage of the regulator 34.

The regulator 34 in the present exemplary embodiment is a low dropout voltage type regulator. Thus, as illustrated in FIG. 7, the regulator 34 is a circuit in which, if a voltage which is equal to or higher than an output voltage of 3 V by the dropout voltage is applied to the input terminal, the output voltage of 3 V is generated.

The regulator 34 is a circuit in which, in a case where an input voltage is equal to or lower than 3 V, a voltage which is equal to or lower than the input voltage by the dropout voltage is output.

Since the regulator 34 has such a circuit configuration, even if a voltage value of the capacitor 32 ranges from 2 V to 3 V, a voltage which is equal to or lower than 2 V to 3 V by the dropout voltage is applied to the main body portion 35.

A rated voltage of the main body portion 35 is 3 V, but the main body portion 35 is configured to be operable if a voltage which is equal to or higher than 2 V is applied. Thus, in a case where light is not applied to the solar cells 31, power generation is stopped, and thus power accumulated in the capacitor 32 is consumed so that a voltage decreases, the main body portion 35 is continuously in an operation state until a voltage of the capacitor 32 is equal to or lower than 2 V.

With this circuit configuration, the time at which the beacon transmission apparatus 10 is brought into a stoppage state is delayed, and thus an operation period of time increases compared with a case where an operation of the main body portion 35 is stopped at the time at which a voltage of the capacitor 32 is equal to or lower than 4 V.

Next, with reference to FIG. 8, a description will be made of a voltage change of the capacitor 32 after lighting of a location where the beacon transmission apparatus 10 of the present exemplary embodiment is provided is brought into an ON state.

Figure 8:
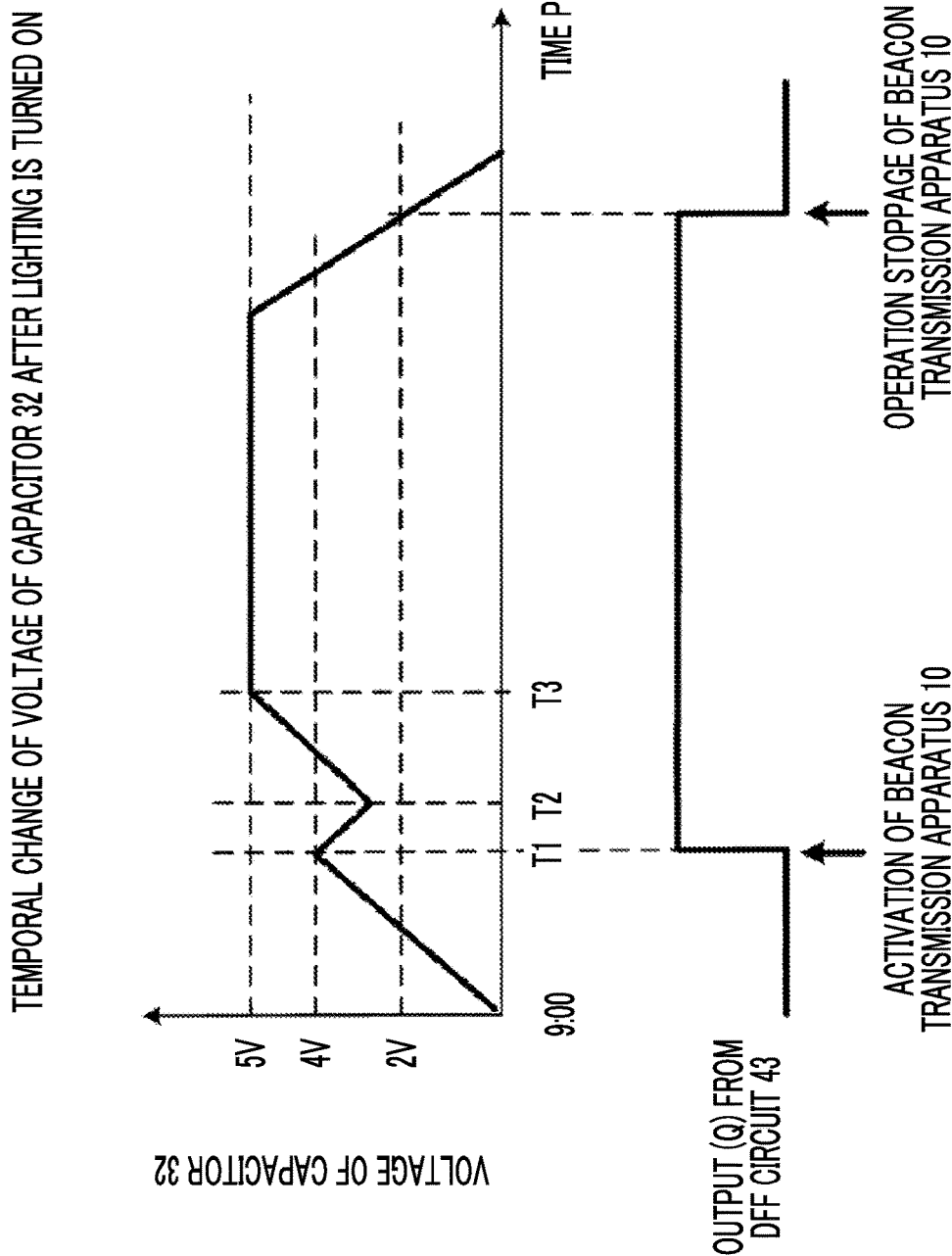
FIG. 8 is a diagram for explaining a voltage change of a capacitor 32 after lighting of a place where the beacon transmission apparatus 10 is provided is brought into an ON state.

In FIG. 8, a case is assumed in which lighting is brought into an ON state at 9:00 in the morning, and thus the solar cells 31 start to generate power. A case is assumed in which an amount of electric charge accumulated in the capacitor 32 at the time of 9:00 is substantially 0, and a voltage of the capacitor 32 is also substantially 0 V.

If the solar cells 31 continue to generate power in this state, an amount of electric charge accumulated in the capacitor 32, and thus a voltage value gradually increases. At a time point T1, if a voltage value of the capacitor 32 exceeds 4 V, a logic state of the output terminal Q of the DFF circuit 43 changes from a low level to a high level. Then, the regulator 34 is also brought into an operation state, so as to supply an output of 3 V to the main body portion 35, and thus the beacon transmission apparatus 10 starts to be activated.

Figure 9:
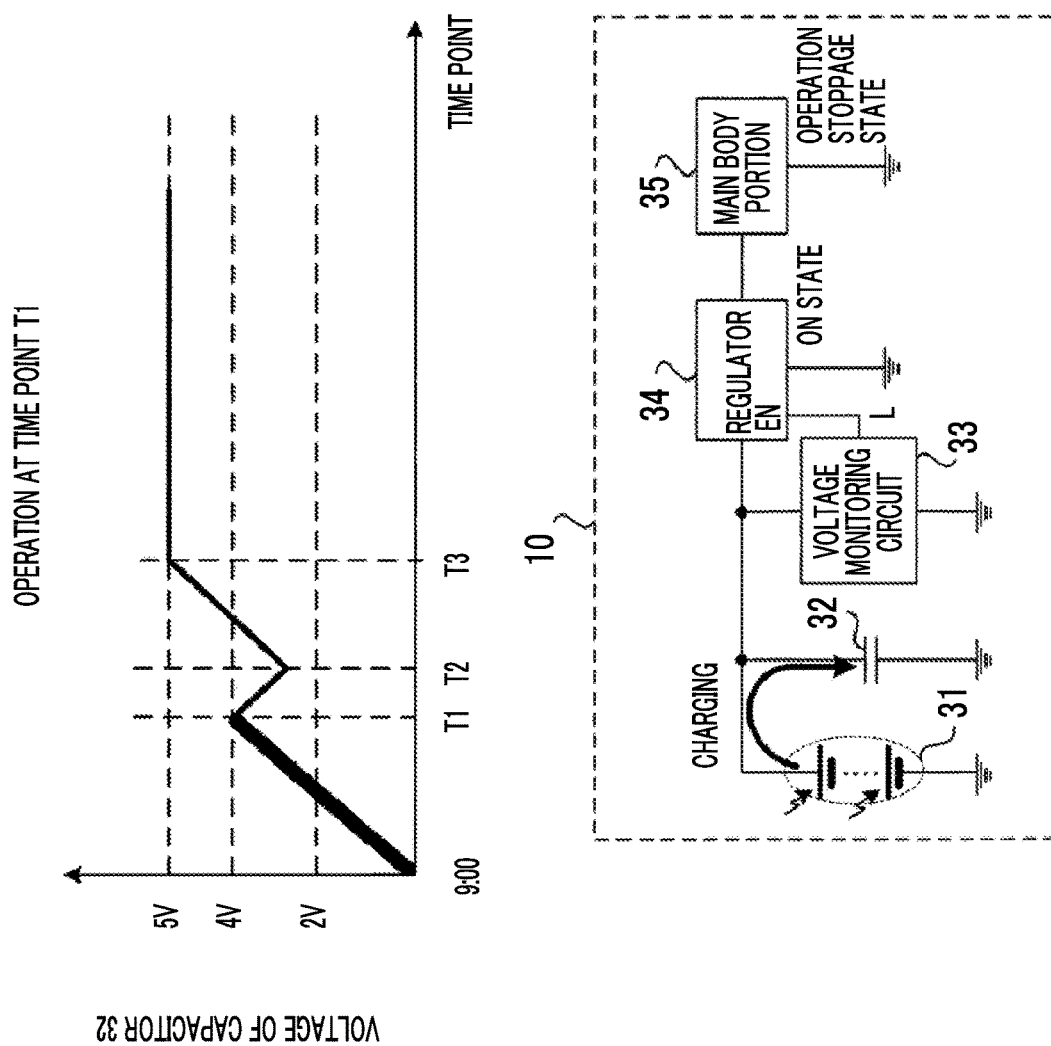
FIG. 9 is a diagram for explaining a state of an operation of the beacon transmission apparatus 10 till a time point T1.

FIG. 9 illustrates a state of an operation of the beacon transmission apparatus 10 till the time point T1. As illustrated in FIG. 9, since a logic of a control signal from the voltage monitoring circuit 33 is at a low level (L) till the time point T1, the regulator 34 is in an OFF state, and thus an operation of the main body portion 35 is also stopped. Thus, till the time point T1 at which a voltage of the capacitor 32 is 4 V from starting of power generation in the solar cells 31, power generated by the solar cells 31 is continuously accumulated in the capacitor 32, and thus a voltage of the capacitor 32 continuously increases.

Here, in a case where the main body portion 35 of the beacon transmission apparatus 10 is activated, larger power than during a steady operation is consumed. Thus, if the beacon transmission apparatus 10 starts to be activated at the time point T1, power consumed in the beacon transmission apparatus 10 is larger than power generated by the solar cells 31, and thus a voltage of the capacitor 32 is temporarily reduced.

However, if the main body portion 35 of the beacon transmission apparatus 10 completes the activation operation and enters a steady state, consumed power is reduced so as to be smaller than generated power in the solar cells 31. Thus, an amount of electric charge accumulated in the capacitor 32 increases, and thus a voltage value changes to an increase (time point T2).

FIG. 10 illustrates a state of an operation of the beacon transmission apparatus 10 from the time point T1 to the time point T2. As illustrated in FIG. 10, at the time point T1, a logic of a control signal from the voltage monitoring circuit 33 transitions to a high level (H) so that the regulator 34 is brought into an ON state, and thus the main body portion 35 performs an activation operation.

Thus, an amount of electric charge reduced from an amount of electric charge accumulated in the capacitor 32 is larger than an amount of electric charge accumulated in the capacitor 32 from the solar cells 31. As a result, a voltage of the capacitor 32 is continuously reduced from the time point T1 to the time point T2 at which the activation operation of the main body portion 35 is completed.

Here, a difference voltage of 2 V between a detection voltage of 4 V of the voltage detection circuit 41 and a detection voltage of 2 V of the voltage detection circuit 42 is set to be higher than a drop voltage of the capacitor 32 caused by the voltage monitoring circuit 33 starting an operation of the main body portion 35.

Thus, even if a voltage of the capacitor 32 temporarily drops due to an activation operation of the beacon transmission apparatus 10, the voltage thereof is not equal to or lower than the detection voltage of 2 V of the voltage detection circuit 42. If a voltage of the capacitor 32 temporarily drops due to an activation operation of the beacon transmission apparatus 10, and the voltage thereof is equal to or lower than the detection voltage of 2 V of the voltage detection circuit 42, an output voltage may not be obtained from the regulator 34, and thus the main body portion 35 is continuously in an operation stoppage state.

In other words, in this case, the beacon transmission apparatus 10 repeats an activation operation, and a stoppage state due to a voltage drop, and thus may not transition to a steady state.

FIG. 11 illustrates a state after a time point T2 at which the beacon transmission apparatus 10 transitions to a steady state, and power consumption is less than in the activation state.

After the time point T2 at which the activation operation is completed, since power consumption in the main body portion 35 is reduced, an amount of electric charge accumulated in the capacitor 32 from the solar cells 31 is larger than an amount of electric charge released from the capacitor 32, and thus a voltage of the capacitor 32 increases. If a voltage of the capacitor 32 reaches 5 V at a time point T3, the voltage of the capacitor 32 is constant as 5 V.

Here, a description will be made of a method of setting a capacitance of the capacitor 32. If a capacitance of the capacitor 32 is set to a great value, the above-described drop voltage when the main body portion 35 is activated may be reduced. However, in a case where a capacitance of the capacitor 32 is set to a great value, the time required for a voltage of the capacitor 32 to be 4 V from starting of a power generation operation of the solar cells 31 is also increased. In other words, the time required for the beacon transmission apparatus 10 to start an operation after lighting of a location where the beacon transmission apparatus 10 is provided is turned on is also increased.

Thus, a capacitance of the capacitor 32 is required to be set to an optimal value on the basis of power consumption during activation of the main body portion 35 or an amount of power generated by the solar cells 31.

MODIFICATION EXAMPLES

In the above-described exemplary embodiment, a description has been made of a case where the invention is applied to the beacon transmission apparatus which is operated by using power generated by the solar cells, but the invention is not limited thereto, and the invention is applicable to other electronic apparatuses which are operated by using power generated by solar cells. For example, the invention is also applicable to electronic apparatuses such as a thermometer or a hygrometer which is operated by using power generated by solar cells.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic apparatus comprising:
   solar cells;
   an accumulation portion that accumulates power generated by the solar cells;
   an electronic apparatus main body portion that is operated by using the power accumulated in the accumulation portion;
   a regulator that converts a voltage accumulated in the accumulation portion into an operation voltage of the electronic apparatus main body portion; and
   an operation control circuit that connects between the accumulation portion and the regulator and controls an operation of the electronic apparatus main body portion by outputting a control signal to the regulator so that, in a case where the voltage of the accumulation portion increases, the regulator starts to convert the operation voltage from the voltage accumulated in the accumulation portion and output the operation voltage to the electronic apparatus main body portion to start the operation of the electronic apparatus main body portion when the voltage of the accumulation portion exceeds a first threshold voltage, and, in a case where the voltage of the accumulation portion decreases, the regulator stops to convert and output the operation voltage to the electronic apparatus main body portion to stop the operation of the electronic apparatus main body portion when the voltage of the accumulation portion is less than a second threshold voltage, which is smaller than the first threshold voltage.

2. The electronic apparatus according to claim 1, wherein a difference voltage between the first threshold voltage and the second threshold voltage is higher than a drop voltage of the accumulation portion caused by the operation control circuit starting an operation of the electronic apparatus main body portion.

3. The electronic apparatus according to claim 1, wherein the operation control circuit includes a first detection portion that outputs a high level signal in a case where the voltage of the accumulation portion exceeds the first threshold voltage, a second detection portion that outputs a high level signal in a case where the voltage of the accumulation portion exceeds the second threshold voltage, and a logic circuit that detects rising of an output signal from the first detection portion to make the control signal for controlling the operation of the electronic apparatus main body portion active, and detects falling of an output signal from the second detection portion to make the control signal inactive.

4. The electronic apparatus according to claim 2, wherein the operation control circuit includes a first detection portion that outputs a high level signal in a case where the voltage of the accumulation portion exceeds the first threshold voltage, a second detection portion that outputs a high level signal in a case where the voltage of the accumulation portion exceeds the second threshold voltage, and a logic circuit that detects rising of an output signal from the first detection portion to make the control signal for controlling the operation of the electronic apparatus main body portion active, and detects falling of an output signal from the second detection portion to make the control signal inactive.

5. The electronic apparatus according to claim 1, wherein the accumulation portion is an electric double layered capacitor.

6. The electronic apparatus according to claim 2, wherein the accumulation portion is an electric double layered capacitor.

7. The electronic apparatus according to claim 3, wherein the accumulation portion is an electric double layered capacitor.

8. The electronic apparatus according to claim 4, wherein the accumulation portion is an electric double layered capacitor.

9. The electronic apparatus according to claim 1, wherein the electronic apparatus main body portion is a transmission portion that transmits a beacon signal including identification information of the electronic apparatus.

10. The electronic apparatus according to claim 2, wherein the electronic apparatus main body portion is a transmission portion that transmits a beacon signal including identification information of the electronic apparatus.

11. The electronic apparatus according to claim 3, wherein the electronic apparatus main body portion is a transmission portion that transmits a beacon signal including identification information of the electronic apparatus.

12. The electronic apparatus according to claim 4, wherein the electronic apparatus main body portion is a transmission portion that transmits a beacon signal including identification information of the electronic apparatus.

13. The electronic apparatus according to claim 5, wherein the electronic apparatus main body portion is a transmission portion that transmits a beacon signal including identification information of the electronic apparatus.

14. The electronic apparatus according to claim 6, wherein the electronic apparatus main body portion is a transmission portion that transmits a beacon signal including identification information of the electronic apparatus.

15. The electronic apparatus according to claim 7, wherein the electronic apparatus main body portion is a transmission portion that transmits a beacon signal including identification information of the electronic apparatus.

16. The electronic apparatus according to claim 8, wherein the electronic apparatus main body portion is a transmission portion that transmits a beacon signal including identification information of the electronic apparatus.

\* \* \* \* \*